(12) United States Patent
Mathieu

(10) Patent No.: US 7,060,418 B2
(45) Date of Patent: Jun. 13, 2006

(54) METHOD FOR THE MANUFACTURE OF A PRINTED CIRCUIT AND PLANAR ANTENNA MANUFACTURED WITH THIS PRINTED CIRCUIT

(75) Inventor: Christophe Mathieu, Saint-Marcel (FR)

(73) Assignee: FCI, Versailles (FR)

( * ) Notice: Subject to any disclaimer, the term of this patent is extended or adjusted under 35 U.S.C. 154(b) by 88 days.

(21) Appl. No.: 10/477,689

(22) PCT Filed: May 23, 2002

(86) PCT No.: PCT/EP02/06921

§ 371 (c)(1),
(2), (4) Date: Nov. 14, 2003

(87) PCT Pub. No.: WO02/096168

PCT Pub. Date: Nov. 28, 2002

(65) Prior Publication Data

US 2004/0159257 A1   Aug. 19, 2004

(30) Foreign Application Priority Data

May 25, 2001   (FR) .................................. 01 07115

(51) Int. Cl.
*G03F 7/00* (2006.01)
*B41F 31/00* (2006.01)

(52) U.S. Cl. ...................... 430/315; 430/311; 430/320; 101/483; 101/491

(58) Field of Classification Search ................ 430/311, 430/315, 320; 101/483, 491
See application file for complete search history.

(56) References Cited

U.S. PATENT DOCUMENTS

| | | | |
|---|---|---|---|
| 4,682,415 A | | 7/1987 | Adell ........................ 29/846 |
| 5,304,411 A | * | 4/1994 | Rusincovitch, Jr. ......... 428/141 |
| 5,622,652 A | | 4/1997 | Kucherovsky et al. ...... 252/511 |
| 2003/0175545 A1 | * | 9/2003 | Kastner et al. ............ 428/626 |

FOREIGN PATENT DOCUMENTS

| | | |
|---|---|---|
| DE | 19841804 A1 | 3/2000 |
| EP | 0809423 A1 | 11/1997 |
| EP | 0839667 A1 | 5/1998 |
| EP | 1014302 A1 | 6/2000 |
| FR | 2464147 | 3/1981 |
| GB | 574946 | 1/1946 |
| WO | WO-0033625 A1 | 6/2000 |

\* cited by examiner

*Primary Examiner*—Nicole Barreca
(74) *Attorney, Agent, or Firm*—Harrington & Smith, LLP

(57) ABSTRACT

In a method for the manufacture of a printed circuit on a dielectric carrier (2), in a first step a circuit pattern (1) is applied with an electrically conductive ink and, in a second step, the circuit model is plated, the electrically conductive ink being applied by means of a method of gravure printing and the plating being done by electrolytic or chemical means.

19 Claims, 2 Drawing Sheets

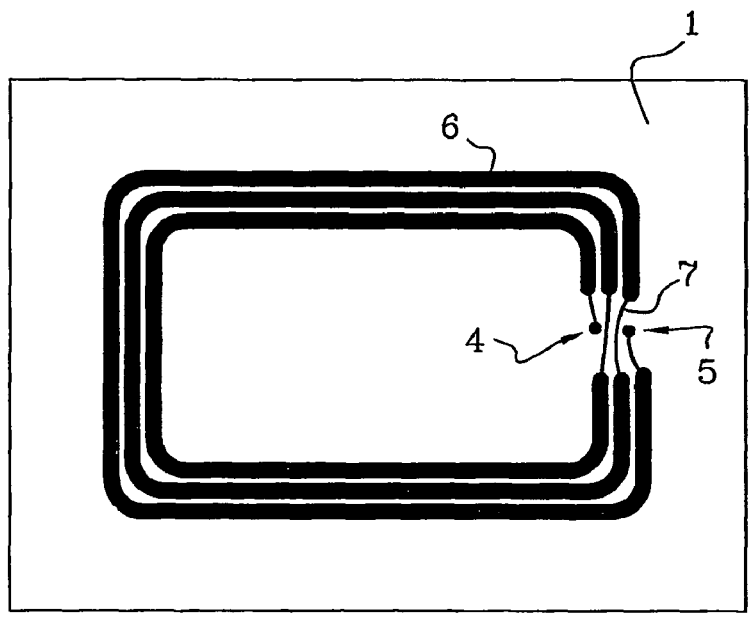
Fig. 2
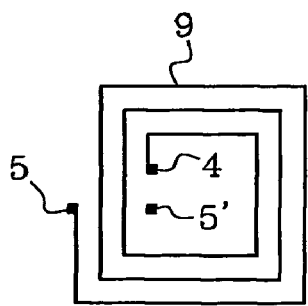 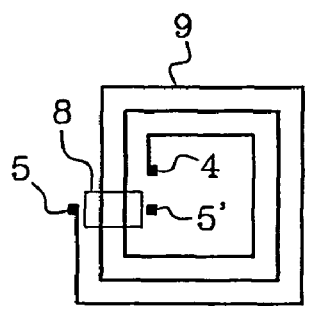 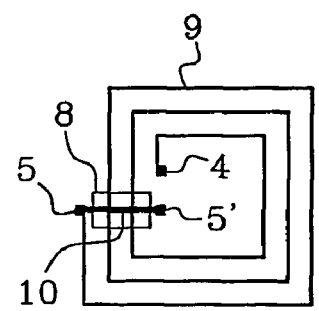
Fig. 3a    Fig. 3b    Fig. 3c

METHOD FOR THE MANUFACTURE OF A PRINTED CIRCUIT AND PLANAR ANTENNA MANUFACTURED WITH THIS PRINTED CIRCUIT

FIELD OF THE INVENTION

The invention relates to a method for the manufacture of a printed circuit on a dielectric carrier, in which a circuit pattern has an electrically conductive ink applied to it, and the circuit obtained is then plated. The invention also relates to a planar antenna manufactured by this method, and its use in smart nomadic objects (such as smart cards, electronic labels, circuit for wireless communications or the like).

A method for the manufacture of a printed circuit of the type described here above is known from WO 99/52336.

BACKGROUND OF THE INVENTION

Cards known as smart cards or chip cards have become prevalent in the field of credit cards, ID cards or the like. These are cards in which data pertaining to the user can be stored. Smart cards of this kind have flat contacts on one face. These flat contacts are put into mechanical contact with corresponding contacts in a smart card reader, for the reading or writing of information. The interrogation of data or the writing of data, after an electrical contact has been set up in a smart card reader, lasts about one second. This is a relatively lengthy period of time and, furthermore, the chip contacts and the corresponding contacts are subjected to a mechanical wearing-out process in the card reader. This may jeopardize the accurate transmission of data. Again, the fouling or oxidation of the respective contact surfaces may have a negative effect on the data transmission process.

SUMMARY OF THE INVENTION

Smart card systems whose operation is mechanically contactless are being developed. A planar antenna connected to a chip and used for contactless data reading and writing is integrated into the cards. Systems of this kind are not subjected to the mechanical wearing out of the contact surfaces. Furthermore, they have an advantage wherein the reading method can be performed more quickly, i.e. in less than about 100 ms. Furthermore, planar antenna systems of this kind are possible for labels and securing systems for goods. Because planar antenna systems of this kind offer numerous possibilities of applications, there has been a search for manufacturing methods appropriate to large-scale, economical and fast production. Known techniques used in the manufacture of integrated switching circuits, for example a chemical etching method, have been resorted to. In such methods, a surface constituted by a conductive material (copper or aluminium), on which a circuit pattern is directly printed or insulated by means of a photoresist, is applied to a substrate. During the subsequent chemical etching process, which is carried out in the conductive layer, only the protected regions of the pattern will remain while the rest of the conductive material is destroyed by the chemical attack process.

For planar antennas, the surface area of the tracks is smaller than the initial surface area of the metal conductor, so that a very large proportion of the conductive layer has to be chemically removed, to the detriment of the optimum functioning of the etching bath and entailing the constraint of waste management. Furthermore, chemical etching limits the carrier materials compatible with this method. Chemical etching also requires a very large number of successive steps. This means that it is not possible to achieve economical production of planar antennas.

There is a method, known from the patent WO 99/52336, for the manufacture of a printed circuit, for which the circuit pattern is printed on to a dielectric carrier, using an electrically conductive ink. As the electrical resistance of these printed conductive tracks is still excessively high, a metal layer is applied with an application tool to the ink tracks. This application tool follows the trace of the conductive tracks. The application tool works like a felt pen, supplying dissolved metal, it being known that, simultaneously, an electrical field is generated so that an electrolytic process takes place on the ink track.

In this method, the circuit pattern must therefore be followed each time with the application tool. This requires a lot of time so that this method, even if it has only two steps, is not appropriate to the large-scale production of planar antennas.

The method described in the patent EP 0910935 also seeks to obtain the electrolytic deposition of a copper layer on an electrically conductive ink. However, the method calls for four successive steps, two steps for the bonding of the conductive ink (a pre-bonding step and an offset printing deposition step) and two steps for the deposition of copper (a first chemical deposition step that is highly time-consuming followed by an electrolytic deposition step). This method is little suited to mass production.

From the teaching of the document U.S. Pat. No. 5,622,652, there is a known one-step method for the manufacture of a printed circuit in which an electrically conductive liquid is applied to a substrate by gravure printing. The tracks formed by this electrically conductive liquid directly form the tracks of the printed circuit. However, the problem posed by this technique is related to the fact that the liquid used has low conductivity. Indeed, according to this teaching, the liquid has metal particles with a diameter of 5 to 10 micrometers, constituting 28 percent by weight of solid matter. Owing to the size of the particles, the deposited layer is thick.

The deposition of an ink layer of this kind raises a second problem which is that of drying it. Indeed, according to this method, the printed circuits then have to be placed in a dryer so that the liquid can be dried in depth. This drying method slows down the mass-production method and reduces its rate. Furthermore, the only way to minimise the drying time is to raise the drying temperature. Now, the use of high temperatures makes it necessary to choose substrates that can withstand these temperatures. This method therefore has the drawback of being restrictive with respect to the substrates that can be used.

It is an aim of the present invention to provide a method for the manufacture of a printed circuit, with which it is possible to obtain the economical and speedy application of large numbers of circuits to carrier materials of any kind. This problem is resolved by the fact that the electrically conductive ink applied by means of a gravure printing method, and that the first deposit is immediately followed by a step for the plating of the deposited ink.

According to another characteristic of the invention, the plating is made directly, by electrolytic or chemical means, on the conductive tracks constituted by the ink. Furthermore, the ink used in the invention has high conductivity and very low electrical resistance. It is therefore possible to deposit a minimum of plating on this ink to form the printed circuit with tracks about 2 to 3 µm thick. Thus, a first saving is obtained in terms of the raw materials used. And the drying of the thin ink deposit can be easily and quickly obtained. Ultraviolet irradiation may be used for example since the ink deposit remains transparent for the thickness values considered. With an ink cross-linkable by UV irradiation, a higher level of polymerisation is obtained than by low-temperature thermal processes. This gives the ink lower resistance enabling the deposition of a thinner plating.

According to one embodiment of the invention, the dielectric carrier is made of PE, PET, PVC, polycarbonate, ABS or impregnated paper, epoxy glass or polyimide substrates etc, and the circuit pattern is formed by means of an electrically conductive ink comprising copper, silver, gold, palladium, tin or alloys of these elements.

Preferably, the plating is done with copper in an electrolytic bath to obtain a copper layer thickness of 2 μm or more.

According to a particular embodiment of the invention, the gravure printing and the plating are done continuously with a carrier in strip form having a travelling speed of over 10 m/minute.

Furthermore, the invention relates to a printed circuit manufactured with a method according to the invention. In particular, it relates to a planar antenna thus manufactured and its use in smart nomadic objects (smart cards, electronic labels, circuit for wireless communications or the like).

BRIEF DESCRIPTION OF THE DRAWINGS

The invention will be understood more clearly from the following description and the appended figures. These figures are given purely by way of an indication and in no way restrict the scope of the invention. Of the figures:

FIG. 2 is a top view of a printed circuit pattern of made according to a first embodiment of the method according to the invention;

FIGS. 3*a*, 3*b* and 3*c* are top views of a printed, circuit pattern made according to a second embodiment of the method according to the invention.

DETAILED DESCRIPTION

Figure 1:
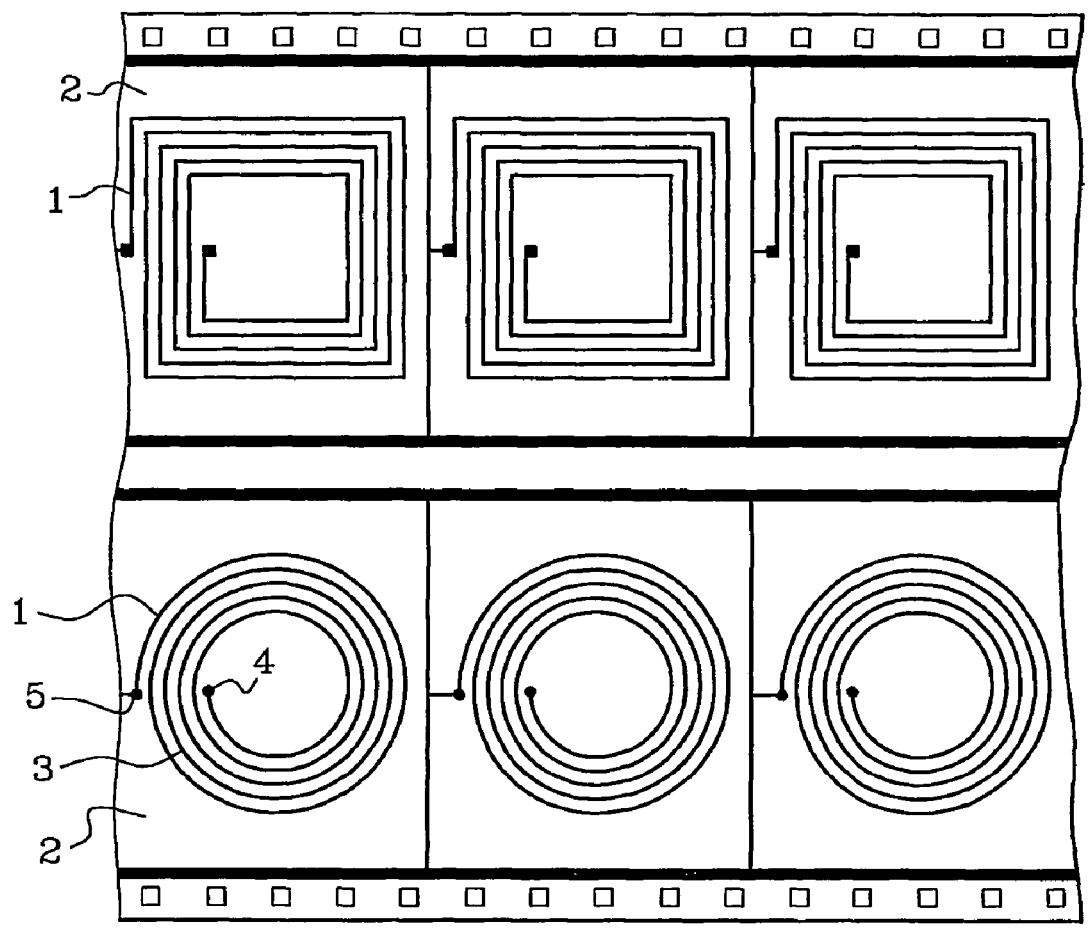
FIG. 1 is a top view of two different models of a planar antenna manufactured with the method according to the invention.

The method of manufacture according to the invention essentially has two steps: in a first step, the model of the circuit to be printed 1, a planar antenna in the case shown in FIG. 1, is applied to a dielectric substrate 2 with an electrically conductive ink.

It has turned out to be the case that the printing methods that could be envisaged are not all equally appropriate for the application of an electrically conductive ink.

According to the invention, the circuit pattern is generated by electromechanical, chemical or laser etching on the gravure printing cylinder. The electrically conductive ink has to be prepared, from the viewpoint of its viscosity and from the viewpoint of its other physical/chemical properties, in such a way so that it is suitable for gravure printing. The circuit pattern manufactured according to the gravure printing method has electrical resistance lower than what would be obtained with circuit patterns manufactured with other printing methods, so that an acceptable electrical resistance is obtained for the final product with the thin metal coating.

The ink chosen is, for example, a metal-charged electrically conductive ink. In this case, the metal is chiefly silver and takes the form of flakes forming micro-wafers. These micro-wafers are preferably very thin (1 to 2 μm) and their length ranges from 2 to 5 μm The proportion of these metal charges ranges from 50 percent to 85 percent by weight of the total mass of the ink. A dry extract of the ink comprises these metal charges. In a preferred example, this dry extract generally represents between 80 and 90 percent of the total mass by weight of the total mass of the ink. Preferably, the proportion of the metal charges is 70 percent of the total mass to ensure high conductivity of the ink thus formed. However, as a trade-off, the highly conductive ink has low resistivity. This facilitates the following plating step.

In one variant, the ink may comprise conductive organic polymers. The advantage of these polymers is that they are formulated in a solvent or aqueous phase by which the rheological properties of the ink obtained can be adjusted in order to make it compatible especially with the gravure printing technique. Another advantage arises from the fact that, in this variant, the ink has no metallic charges. This contributes to a cost reduction in large-scale production, and facilitates the obtaining of homogeneous ink by which the manufacturing method can be made more reliable.

The gravure printing method is a high-speed method with which the substrate in strip form can be imprinted at a travel speed of 100 m/minute. The electrolytic deposition of the copper, on the contrary, is slower at about 10 m/minute. The track and inter-track spatial resolution is about 100 μm, which is quite sufficient for the manufacture of planar antennas. Furthermore, the gravure printing technique requires only a small quantity of electrically conductive ink (5 to 10 g/m$^2$). This quantity is particularly smaller than that required for printing methods such as silk-screen printing, for which it is necessary to apply 50 to 100 g/m$^2$, but it is similar to that required for offset printing. The ink can be dried at a temperature of below 60° C., thus enabling the use of the widest range of existing carrier materials, especially materials like PVC, which would get deformed at hotter temperatures.

After the electrically conductive ink is applied to the carrier material, the carrier is passed into an electrolytic bath for the application of a metal layer with a thickness of 2 μm or more. In the case of a planar antenna, passivated copper is used, so that the natural oxidation kinetics of copper are considerably reduced.

The materials envisaged for the dielectric substrates are PE, PET, PVC, polycarbonate, ABS or impregnated paper, epoxy glass or polyimide substrates etc.

A planar antenna manufactured according to the method described here above may be integrated in a simple way into circuit systems in contactless cards or the like. The bonding can be done by the usual methods such as wire bonding or flip-chip bonding or the like. The wide possibility of choices available as regards materials for the substrate and the low consumption of material as well as the high speed at which the manufacturing method takes place provides for economical and fast manufacture. Consequently, the method according to the invention is particularly appropriate to the large-scale production of planar antennas or similar circuits.

However, a planar antenna of this kind needs to be connected to an integrated circuit, also called a chip, to make it possible to read or write data in a memory of this integrated circuit.

A chip is small-sized, and has a small surface area of about 2 to 10 mm$^2$. Now, the tracks of the antenna are generally formed by making concentric coils 3 in such a way that a first end 4 of the track is located at the centre of the smallest coil and a second end 5 of this track is located outside the biggest coil. The result is that these two ends 4 and 5 are commonly separated by a distance greater than the dimensions of the chip. To be able to connect the chip to these two ends, which form connection pads, it is sought to bring them as close to each other as possible.

According to a first embodiment, shown in FIG. 2, it is planned to narrow the width of the tracks at each of the coils, at least locally, and bring them closer to each other at this level. Thus, each coil has a first portion 6 with a track width greater than that of a second coil portion 7. The second portions 7 are also brought closer to each other. With a gravure printing method, these portions can be brought closer together in this way because it is possible to obtain a track width of about 100 μm, and also an inter-track width of about 100 μm. The ends are thus sufficiently close to each other and the pads of the chip may be superimposed in order to be put into contact. This contact may be made, for example, by means of polymer or metal bumps deposited on the pads of the chip in order to connect the ends. In this case, the chip-antenna unit is then surrounded by a resin to protect the connection. In one variant, an anisotropic conductive film (ACF) or an anisotropic conductive paste (ACP), whose electrical conductivity is limited to only one spatial direction, may be applied. In the variant implementing an anisotropic paste, the connection and protection functions are performed simultaneously. It may be planned to have this paste printed by gravure printing directly on the planar antenna, so that only the chip connection operation remains to be done.

According to a second embodiment, shown in FIGS. 3a, 3b and 3c, it may be planned to bring these two ends together by making a "bridge" to bring the second end close to the vicinity of the first one. In this case, to enable the second end to go above the coils, an insulating layer 8 is placed between these tracks and the second end. In this case, during a first run, the first end 4, first end 4 forming an internal pad, and an unconnected pad 5' juxtaposed with the internal pad 4 are formed. The second end 5 forms an external pad and is not connected to the unconnected pad 5'. The antenna 9 planned in this embodiment is not yet obtained. Then, the insulating layer 8 is deposited and, finally, during a second run, the conductive bridge 10 connecting the external pad 5 of the antenna 9 with the unconnected pad 5' is made. The bridge 10 goes above the insulating layer 8. Thus the second end 5 may be brought inside the smallest coil, in the vicinity of the first end 4. The two runs may be made serially by means of series-mounted gravure printing cylinders. During the second run, coils can be added to the antenna 9.

According to a third embodiment, wherein the two faces of the carrier substrate may be used, it is planned to place a module containing the chip on that side of the substrate which does not have the tracks of the printed circuit. This module is then mechanically gripped on this face in such a way that it comes into contact with the ends of the antenna brought to the other face. However, this technique requires that the carrier substrate of the antenna should not be excessively thick, and that it should have a thickness at most equal to 50 μm.

According to a fourth embodiment, in which the two faces of the substrate may also be used, it is planned to first perforate the substrate. These perforations form plated through holes in the substrate, and enable communication between a first face of the substrate and a second face of the substrate. Then the perforated substrate is printed. The ink is deposited in the antenna pattern on the first face and a connection circuit pattern of the circuit designed to receive the chip is deposited simultaneously or successively on the second face. The through holes are filled with ink owing to the viscosity of the ink and the size of the holes. The substrate thus coated with ink is then placed in the electrolytic bath where the copper-coating of all the ink-covered regions is obtained. At the holes, conductivity is assured between the first and second faces of the substrate. The pattern of the protection circuit provides especially for bringing at least two holes of the substrate close together.

The invention claimed is:

1. Method for the manufacture of a printed circuit on a dielectric carrier, wherein, a circuit pattern is applied with an electrically conductive ink to said carrier, characterized in that said carrier is then plated, and in that the electrically conductive ink is applied by means of a method of gravure printing.

2. Method for the manufacture of a printed circuit according to the claim 1, characterized in that the ink comprises metal particles in a proportion greater than 50 percent by weight of the total mass of the ink.

3. Method for the manufacture of a printed circuit according to claim 1, characterized in that the circuit pattern is formed by means of an electrically conductive ink comprising copper, silver, gold, palladium, tin or alloys of these elements.

4. Method for the manufacture of a printed circuit according to the claim 1, characterized in that the ink comprises conductive organic polymers and displays high conductivity.

5. Method for the manufacture of a printed circuit according to claim 1, characterized in that the plating is done directly, by electrolytic or chemical means, on the conductive track constituted by the ink.

6. Method for the manufacture of a printed circuit according to claim 1, characterized in that the circuit pattern is a planar antenna.

7. Method for the manufacture of a printed circuit according to claim 1, characterized in that dielectric carrier is made of PE, PVC or PET, polycarbonate, ABS, epoxy or polyimide, or else a sheet of impregnated paper.

8. Method according to claim 1, characterized in that the plating is made with copper in an electrolytic bath, with a copper layer thickness of up to 2 μm or more.

9. Method according to claim 8, characterized in that the gravure printing and the plating are done continuously with a travelling speed for the carrier, which is in strip form, that is over 10 m/minute.

10. Method according to claim 1, characterized in that the circuit pattern is generated on the gravure printing cylinder by a process of electromechanical, chemical or laser etching.

11. Method for the manufacture of a printed circuit according to claim 1, characterized in that plated through holes are made in the substrate, and in that the substrate is coated with ink on both its faces by gravure printing.

12. Method according to claim 11, characterized in that both faces are coated simultaneously.

13. Method for the manufacture of a printed circuit according to claim 1, characterized in that a first layer of ink, forming an open coil model on the substrate with an internal pad, an external pad and an unconnected pad, followed by a step during which an insulating layer is deposited between the unconnected pad and the external pad, and in that the connection between the external pad and the unconnected pad is made contiguously with the same ink as that of the first layer.

14. Printed circuit on a dielectric carrier, characterized by its manufacture according to claim 1.

15. Printed circuit according to claim 14, characterized in that this circuit is used as a planar antenna.

16. Use of the printed circuit according to claim 15, as a planar antenna in smart nomadic objects.

17. A method for the manufacture of a printed circuit on a dielectric carrier comprising:

applying a circuit pattern to the dielectric carrier with an electrically conductive ink, wherein the electrically conductive ink is applied by gravure printing; and plating the circuit pattern with an electrically conductive material after applying the circuit pattern to the dielectric carrier.

18. A printed circuit comprising:

a carrier comprising a dielectric material;

a gravure printed circuit pattern on the carrier, wherein the circuit pattern comprises an electrically conductive ink; and electrically conductive plating layer on the circuit pattern.

19. A printed circuit as in claim 18 wherein the printed circuit pattern comprises an antenna pattern.

* * * * *